(12) United States Patent
Cha et al.

(10) Patent No.: US 9,312,279 B2
(45) Date of Patent: Apr. 12, 2016

(54) THIN FILM TRANSISTOR ARRAY SUBSTRATE, METHOD OF MANUFACTURING THE SAME, AND DISPLAY APPARATUS INCLUDING THE SAME

(71) Applicant: SAMSUNG DISPLAY CO., LTD., Yongin, Gyeonggi-Do (KR)

(72) Inventors: Myoung-Geun Cha, Yongin (KR); Yoon-Ho Khang, Yongin (KR); Hyun-Jae Na, Yongin (KR); Sang-Ho Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 63 days.

(21) Appl. No.: 14/170,202

(22) Filed: Jan. 31, 2014

(65) Prior Publication Data

US 2015/0069378 A1 Mar. 12, 2015

(30) Foreign Application Priority Data

Sep. 11, 2013 (KR) .................... 10-2013-0109215

(51) Int. Cl.
*H01L 21/00* (2006.01)
*H01L 27/12* (2006.01)

(52) U.S. Cl.
CPC .......... *H01L 27/1225* (2013.01); *H01L 27/124* (2013.01); *H01L 27/127* (2013.01); *H01L 27/1222* (2013.01)

(58) Field of Classification Search
CPC ............ H01L 27/1214; H01L 27/1222; H01L 27/124; H01L 27/127; H01L 27/1288

USPC .......................................................... 438/34
See application file for complete search history.

(56) References Cited

U.S. PATENT DOCUMENTS

| 7,804,091 | B2 | 9/2010 | Takechi et al. |
| 2011/0291096 | A1 | 12/2011 | Ryoo et al. |
| 2014/0183522 | A1 | 7/2014 | Cha et al. |

FOREIGN PATENT DOCUMENTS

| JP | 2010-245118 | 10/2010 |
| KR | 10-0318541 | 12/2001 |

(Continued)

OTHER PUBLICATIONS

English Abstract for Publication No. 10-2000-2260803 (FOR 10-0318541).

(Continued)

*Primary Examiner* — Kenneth Parker
*Assistant Examiner* — John Lin
(74) *Attorney, Agent, or Firm* — F. Chau & Associates, LLC

(57) ABSTRACT

A thin film transistor (TFT) array substrate includes a substrate, a gate electrode, a gate line, a first data line, and a second data line on the substrate, a gate insulating layer that covers the gate electrode and the gate line and includes a first opening that exposes a portion of the first data line and a second opening that exposes a portion of the second data line, an active layer disposed on the gate insulating layer so that at least one portion of the active layer overlaps the gate electrode, a drain electrode and a source electrode that extend from opposite sides of the active layer, a pixel electrode that extends from the drain electrode, and a connection wiring that extends from the source electrode, and connects the first data line to the second data line through the first and second openings of the gate insulating layer.

9 Claims, 15 Drawing Sheets

(56) References Cited

FOREIGN PATENT DOCUMENTS

| KR | 10-2009-0016340 | 2/2009 |
| KR | 10-2012-0065902 | 6/2012 |
| KR | 10-2012-0075111 | 7/2012 |
| KR | 10-2012-0124802 | 11/2012 |
| KR | 10-1200237 | 11/2012 |
| KR | 10-2012-0132853 | 12/2012 |
| KR | 10-2013-0036681 | 4/2013 |

OTHER PUBLICATIONS

English Abstract for Publication No. 10-2012-0062376 (FOR 10-1200237).

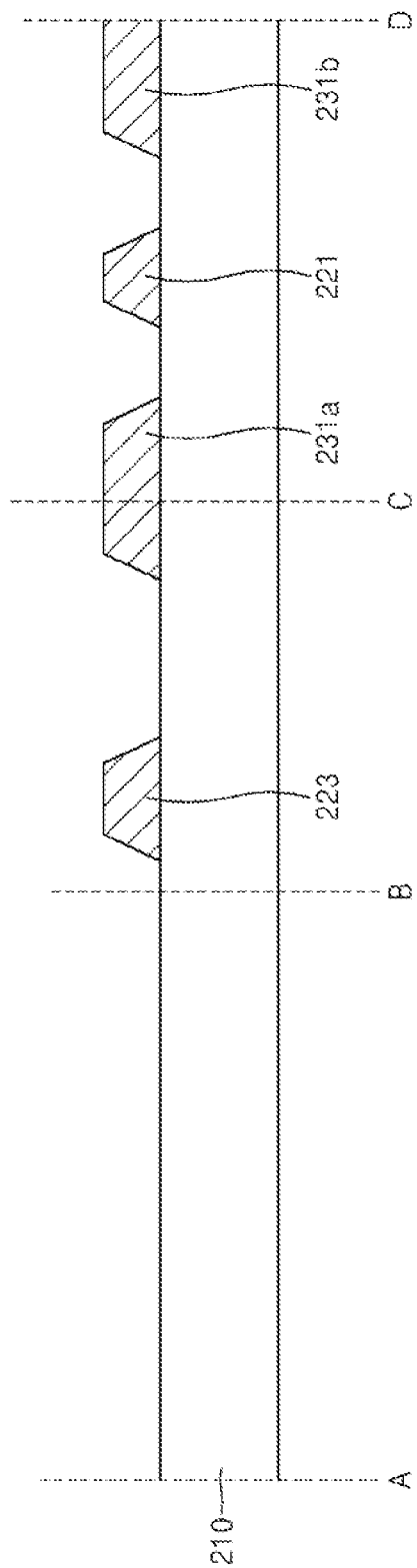

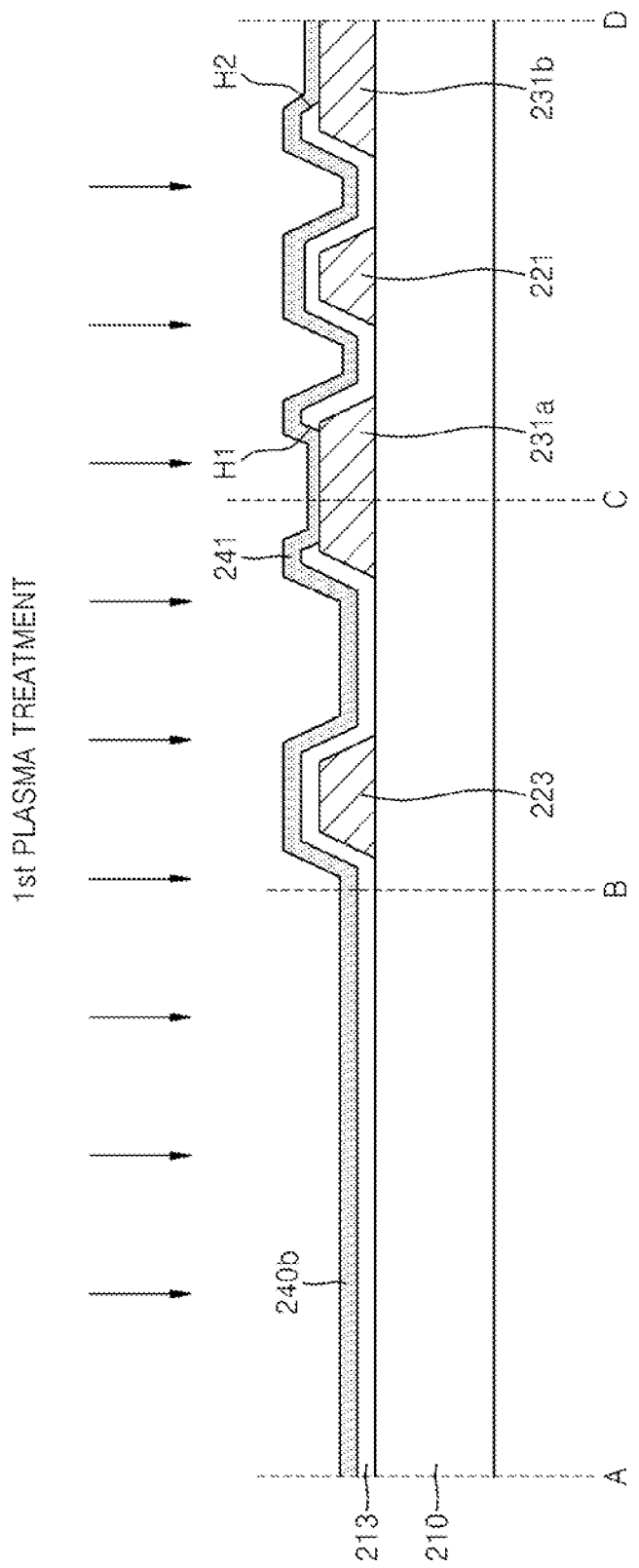

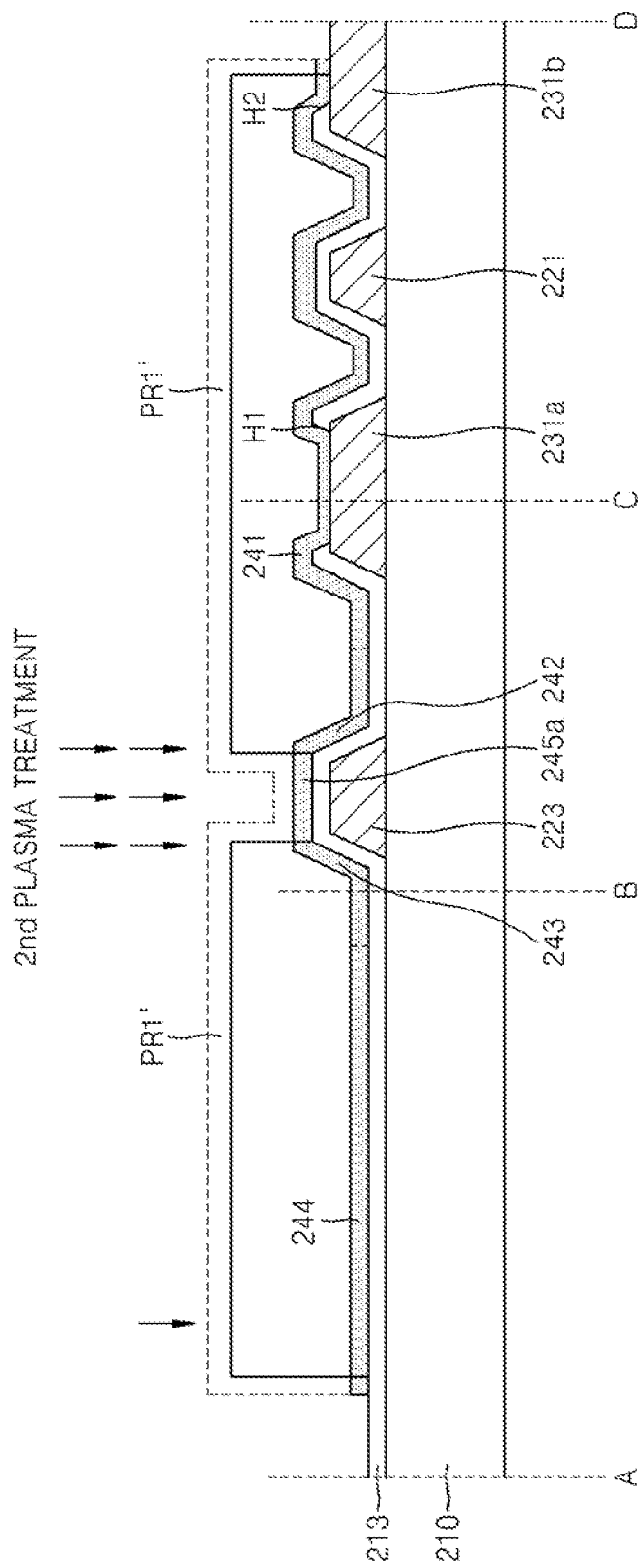

THIN FILM TRANSISTOR ARRAY SUBSTRATE, METHOD OF MANUFACTURING THE SAME, AND DISPLAY APPARATUS INCLUDING THE SAME

RELATED APPLICATIONS

This application claims priority under 35 U.S.C. 119 from Korean Patent Application No. 10-2013-0109215, filed on Sep. 11, 2013, in the Korean Intellectual Property Office, and all the benefits accruing therefrom, the contents of which are herein incorporated by reference in their entirety.

BACKGROUND

1. Technical Field

One or more embodiments of the present disclosure are directed to a thin film transistor (TFT) array substrate, a method of manufacturing the same, and a display apparatus including the same, and more particularly, to a TFT array substrate using an oxide semiconductor, a method of manufacturing the same, and a display apparatus including the same.

2. Discussion of the Related Art

A flat panel display apparatus, such as an organic light-emitting display apparatus and a liquid crystal display (LCD) apparatus, typically includes a TFT, a capacitor, and a line connecting the TFT to the capacitor.

A substrate used to manufacture a flat panel display apparatus typically includes a fine pattern from which a plurality of TFTs, a plurality of capacitors, and a plurality of lines are formed, and a photolithography process is typically used to form the fine substrate pattern by using a mask to a pattern.

In a typical photolithography process, a photoresist is uniformly coated on the substrate on which a pattern is to be formed, exposure equipment such as a stepper exposes the photoresist, and the exposed photoresist is developed. After developing the photoresist, the pattern of the substrate is etched using the remaining photoresist, and after forming the pattern, the undesired photoresist is removed.

As described above, in the process of transferring the pattern using a mask, a mask that includes a desired pattern is first prepared. Thus, as the number of processes using the mask increases, the manufacturing cost for preparing the mask increases. In addition, since the above-described stages are complicated, the manufacturing time and cost increases.

SUMMARY

One or more embodiments of the present disclosure include a TFT array substrate, a method of manufacturing the same, and a display apparatus including the same.

Additional aspects will be set forth in part in the description which follows and, in part, will be apparent from the description, or may be learned by practice of the disclosed embodiments.

According to one or more embodiments of the present disclosure, a thin film transistor (TFT) array substrate includes: a gate electrode, a gate line, a first data line, and a second data line disposed on a substrate; a gate insulating layer that covers the gate electrode and the gate line, and includes a first opening that exposes a portion of the first data line and a second opening that exposes a portion of the second data line; an active layer disposed on the gate insulating layer so that at least one portion of the active layer overlaps the gate electrode; a drain electrode and a source electrode that extend from opposite sides of the active layer; a pixel electrode that extends from the drain electrode; and a connection wiring that extends from the source electrode, and connects the first data line to the second data line through the first and second openings of the gate insulating layer.

A conductivity of the drain electrode, the source electrode, the pixel electrode, and the connection wiring may be adjusted by adjusting a carrier concentration of an oxide semiconductor.

The drain electrode, the source electrode, the pixel electrode, and the connection wiring may are made conductive by a first plasma treatment performed on an oxide semiconductor using a hydrogen (H)-based gas, a fluorine (F)-based gas, a combination thereof, or a nitrogen ($N_2$) gas.

The active layer may include an oxide semiconductor.

The active layer, the drain electrode, the source electrode, the pixel electrode, and the connection wiring may be disposed in a same layer that includes a-In—Ga—Zn—O (a-IGZO).

Each of the drain electrode, the source electrode, the pixel electrode, and the connection wiring may include a lower layer that was made conductive by adjusting a carrier concentration of an oxide semiconductor; and an upper layer that comprises a conductive material.

The TFT array substrate may further include an opposite electrode disposed on the pixel electrode; and an intermediate layer disposed between the pixel electrode and the opposite electrode. The intermediate layer may be one of a liquid crystal layer or an organic emission layer.

According to one or more embodiments of the present disclosure, a method of manufacturing a thin film transistor (TFT) array substrate includes forming a gate electrode, a gate line, a first data line, and a second data line on a substrate through a first mask operation; forming a gate insulating layer that covers the gate electrode, the gate line, the first data line, and the second data line; forming a first opening and a and second opening in the gate insulating layer that respectively expose a portion of the first data line and a portion of the second data line through a second mask operation; forming an oxide semiconductor layer on the gate insulating layer; performing a first plasma treatment on the oxide semiconductor layer to form a conductive oxide layer; and forming a pixel electrode, a drain electrode, a source electrode, a connection wiring, and an active layer from the conductive oxide layer through a third mask operation.

The active layer may be disposed on the gate insulating layer so that at least one portion of the active layer overlaps the gate electrode. The drain electrode and the source electrode may extend from opposite sides of the active layer. The pixel electrode may extend from the drain electrode. The connection wiring may connect the first data line to the second data line through the first opening and the second opening.

The third mask operation may include forming a photoresist on the conductive oxide layer using a halftone mask, wherein said photoresist includes a first part and a second part having a thickness less than a thickness of the first part; etching the conductive oxide layer to form the pixel electrode, the drain electrode, the source electrode, and the connection wiring; etching the second part of the photoresist to expose an auxiliary-active layer in the conductive oxide layer; and a performing second plasma treatment on the auxiliary-active layer to form the active layer, wherein the second plasma treatment changes the auxiliary-active layer into a semiconductor, wherein the first part of the photoresist is formed in a region corresponding to the pixel electrode, the drain electrode, the source electrode, and the connection wiring, and the second part of the photoresist is formed on the auxiliary-active layer.

The method may further include removing the first part of the photoresist, and performing a cleaning process.

The first plasma treatment may use a hydrogen (H)-based gas, a fluorine (F)-based gas, or a combination thereof.

The first plasma treatment may use a nitrogen ($N_2$)-based gas, and may include an annealing process at a temperature of about 300 degrees C. to about 400 degrees C.

The second plasma treatment may use an oxygen-containing gas that changes the auxiliary-active layer into the active layer by changing a carrier concentration of the conductive oxide layer, wherein the active layer is a semiconductor.

The second plasma treatment may change a carrier concentration of the active layer to a value within a range of about $10^{14}$ to about $10^{18}/cm^2$.

The oxide semiconductor layer may be an In—Ga—Zn—O (IGZO) semiconductor.

According to one or more embodiments of the present disclosure, a thin film transistor (TFT) array substrate includes an active layer that is disposed on a gate insulating layer on a substrate; a drain electrode and a source electrode that extend from opposite sides of the active layer; a pixel electrode that extends from the drain electrode; and a connection wiring that extends from the source electrode. The active layer, the drain electrode, the source electrode, the pixel electrode, and the connection wiring have been made conductive from a first plasma treatment that adjusted a carrier concentration of an oxide semiconductor.

A gate electrode, a gate line, a first data line, and a second data line may be disposed on the substrate, the gate insulating layer covers the gate electrode and the gate line, and includes an opening that exposes a portion of the first data line and a portion of the second data line, at least one portion of the active layer overlaps the gate electrode, and the connection wiring connects the first data line to the second data line through the opening of the gate insulating layer.

The first plasma treatment may use a hydrogen (H)-based gas, a fluorine (F)-based gas, or a combination thereof, and changes a carrier concentration of the drain electrode, the source electrode, the pixel electrode, and the connection wiring to about $10^{19}/cm^2$ or more.

The active layer may be made conductive by a second plasma treatment that adjusts a carrier concentration of an conductive oxide layer to change the conductive oxide layer into a semiconductor, and the second plasma treatment may use an oxygen-based gas.

BRIEF DESCRIPTION OF THE DRAWINGS

FIGS. 4A to 4H are cross-sectional views that sequentially illustrates a method of manufacturing a TFT array substrate according to embodiments of the present disclosure.

DETAILED DESCRIPTION

Figure 1:
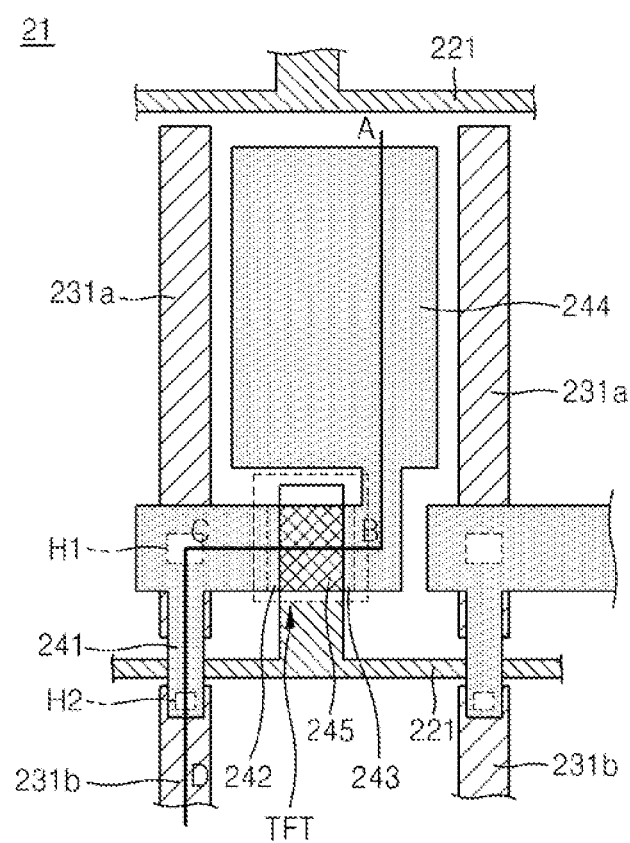
FIG. 1 is a plan view of a TFT array substrate according to an embodiment of the present disclosure.

Reference will now be made in detail to exemplary embodiments, examples of which are illustrated in the accompanying drawings, wherein like reference numerals may refer to like elements throughout. In this regard, the present embodiments may have different forms and should not be construed as being limited to the descriptions set forth herein.

In the following embodiments, when an element such as a layer or a region is referred to as being "on" another element, this includes a case where one element is disposed between other elements, in addition to a case where one element is disposed directly on the other element.

Figure 2:
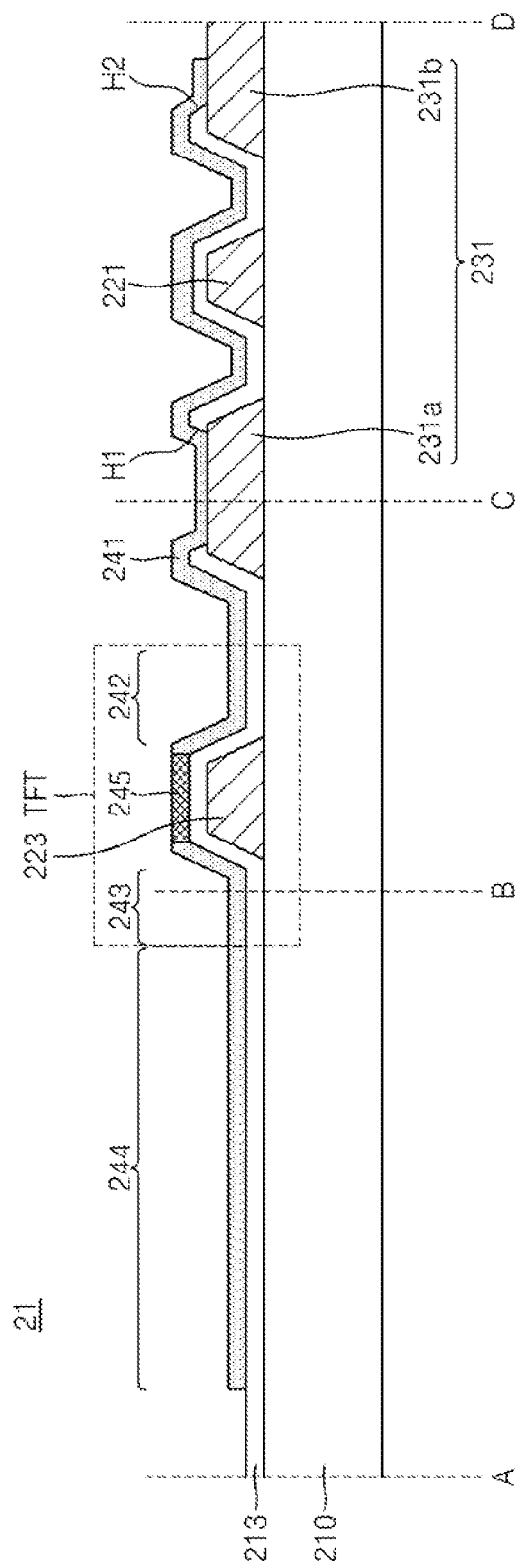
FIG. 2 is a cross-sectional view taken along line A-B-C-D of the TFT array substrate of FIG. 1.

FIG. 1 is a plan view of a TFT array substrate 21 according to an embodiment of the present disclosure. FIG. 2 is a cross-sectional view taken along line A-B-C-D of the TFT array substrate 21 of FIG. 1.

Referring first to FIG. 1, one pixel region of the TFT array substrate 21 is illustrated. The pixel region may be defined as a space formed between two adjacent data lines 231 and two adjacent gate lines 221 in the TFT array substrate 21. A thin film transistor TFT may be formed in space of the pixel region.

FIG. 1 shows one thin film transistor as being formed in one pixel region, but this configuration is exemplary and non-limiting and is for convenience of description. Other embodiments of the present disclosure may include a plurality of thin film transistors and a plurality of storage capacitors in each pixel.

Referring to FIGS. 1 and 2, the TFT array substrate 21 includes a substrate 210, a thin film transistor TFT, gate lines 221, data line 231, and a pixel electrode 244.

The substrate 210 may be formed of a glass material, a plastic material, or a metal material. The substrate 210 may be a flexible substrate.

A buffer layer may be disposed on the substrate 210. The buffer layer enables a flat surface to be disposed on the substrate 210, and may include an insulating material to prevent moisture and foreign material from penetrating into the substrate 210. The buffer layer is optional depending on the case.

The thin film transistor TFT may be disposed on the substrate 210. The thin film transistor TFT may include a gate electrode 223 connected to the gate line 221, a gate insulating layer 213 on the gate electrode 223, an active layer 245 on the gate insulating layer 213, and a source electrode 242 and a drain electrode 243 that extend from opposite sides of the active layer 245.

Regarding an operation of the thin film transistor TFT, when a channel is formed in the active layer 245 by a gate signal received from the gate line 221, a data voltage received from the data line 231 may be transmitted to the drain electrode 243 through the source electrode 242 and the active layer 245, and may be applied to the pixel electrode 244. The pixel electrode 244 may apply the data voltage to an organic light-emitting device included in each pixel, thereby adjusting brightness of each pixel. As another example, in an LCD apparatus, the pixel electrode 244 may drive a liquid crystal layer using the data voltage to adjust brightness of each pixel.

The gate electrode 223, the gate line 221, and the data line 231 may be formed from the same material at the same time. In some embodiments, the gate electrode 223, the gate line 221, and the data line 231 may be formed of titanium (Ti) or copper (Cu). In some embodiments, the gate electrode 223, the gate line 221, and the data line 231 may have a Ti/Cu stack structure.

The data line 231 may include first and second data lines 231*a* and 231*b* that are separated from each other. Each of the first and second data lines 231*a* and 231*b* may form a single row, and the gate line 221 may cross the data line 231 in the space between the first and second data lines 231*a* and 231*b*.

The gate insulating layer 213 covers the gate electrode 223 and the gate line 221, and includes an opening H1 that exposes a portion of the first data line 231*a*, and an opening H2 that exposes a portion of the second data line 231*b*. The gate insulating layer 213 may be formed of an insulating material, and may electrically separate the gate electrode 223 from the active layer 245. In some embodiments, the gate insulating layer 213 may be formed of a single layer of an inorganic material or an organic material, or may be formed as a stacked structure that includes an inorganic material and an organic material.

The active layer 245 is disposed on the gate insulating layer 213 so that at least one portion of the active layer 245 can overlap the gate electrode 223.

The active layer 245 may be formed of an oxide semiconductor. Examples of an oxide semiconductor may include an oxide of a material selected from group-12, 13 and 14 metal elements, such as zinc (Zn), indium (In), calcium (Ca), cadmium (Cd), germanium (Ge), and hafnium (Hf), or a combination thereof.

In some embodiments, the active layer 245 may be formed of a Zn oxide-based material, for example, Zn oxide, In—Zn oxide, or Ga—In—Zn oxide. In some embodiments, the active layer 245 may be an In—Ga—Zn—O (IGZO) semiconductor in which metals such as In and Ga are contained in ZnO.

The conductivity of the active layer 245 may be adjusted by adjusting the oxide semiconductor carrier concentration, and by adjusting the carrier concentration, the active layer 245 may change into a semiconductor. The oxide semiconductor carrier concentration may be adjusted by plasma treatment. This will be described below with reference to FIGS. 4E and 4G. In some embodiments, a carrier concentration of the active layer 245 may have a value in a range of about $10^{14}$ to $10^{18}/cm^2$.

The source electrode 242 and drain electrode 243 are disposed on each side of the active layer 245, and the pixel electrode 244 extends from the drain electrode 243. A connection wiring 241 is connected to the first data line 231*a* through the opening H1 of the gate insulating layer 213, and is connected to the second data line 231*b* through the opening H2 of the gate insulating layer 213. Therefore, the first and second data lines 231*a* and 231*b* may be electrically connected to each other.

The drain electrode 243, the source electrode 242, the pixel electrode 244, and the connection wiring 241 may be formed from the same material at the same time. In some embodiments, by adjusting the oxide semiconductor carrier concentration, the drain electrode 243, the source electrode 242, the pixel electrode 244, and the connection wiring 241 may become conductive. The oxide semiconductor carrier concentration may be adjusted through a plasma treatment.

A first plasma treatment, which provides conductivity by increasing the oxide semiconductor carrier concentration, may be performed using a hydrogen (H)-based gas, a fluorine (F)-based gas, or a combination thereof.

A hydrogen ($H_2$) gas may penetrate below the surface of the oxide semiconductor to increase the carrier concentration, thereby decreasing surface resistance. In addition, plasma treatment using hydrogen gas may remove oxygen from the surface to reduce metal oxide, which also decreases surface resistance.

On the other hand, performing a fluorine-based plasma treatment increases an F component of the oxide semiconductor, which reduces the oxygen component, to generate an additional carrier at the surface. Accordingly, the carrier concentration increases, and the surface resistance decreases.

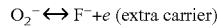

$O_2^- \leftrightarrow F^- + e$ (extra carrier)

A fluorine (F)-based gas may be $CF_4$, $C_4F_8$, $NF_3$, $SF_6$, or a combination thereof, but is not limited thereto.

In another embodiment, the first plasma treatment may be performed using a nitrogen gas. An annealing process may be performed simultaneously with the nitrogen plasma treatment. In some embodiments, the annealing process may be performed for about one hour to about two hours at a temperature of about 300 degrees C. to about 400 degrees C.

The oxide semiconductor carrier concentration may be adjusted within a range of about $10^{14}$ to about $10^{18}/cm^2$ or more by the first plasma treatment.

As described above, the active layer 245, the drain electrode 243, the source electrode 242, the pixel electrode 244, and the connection wiring 241 may be formed from an oxide semiconductor, and then by adjusting the carrier concentration, the TFT array substrate 21 according to an embodiment of the present disclosure may be formed. Accordingly, a process is simplified.

Figure 3:
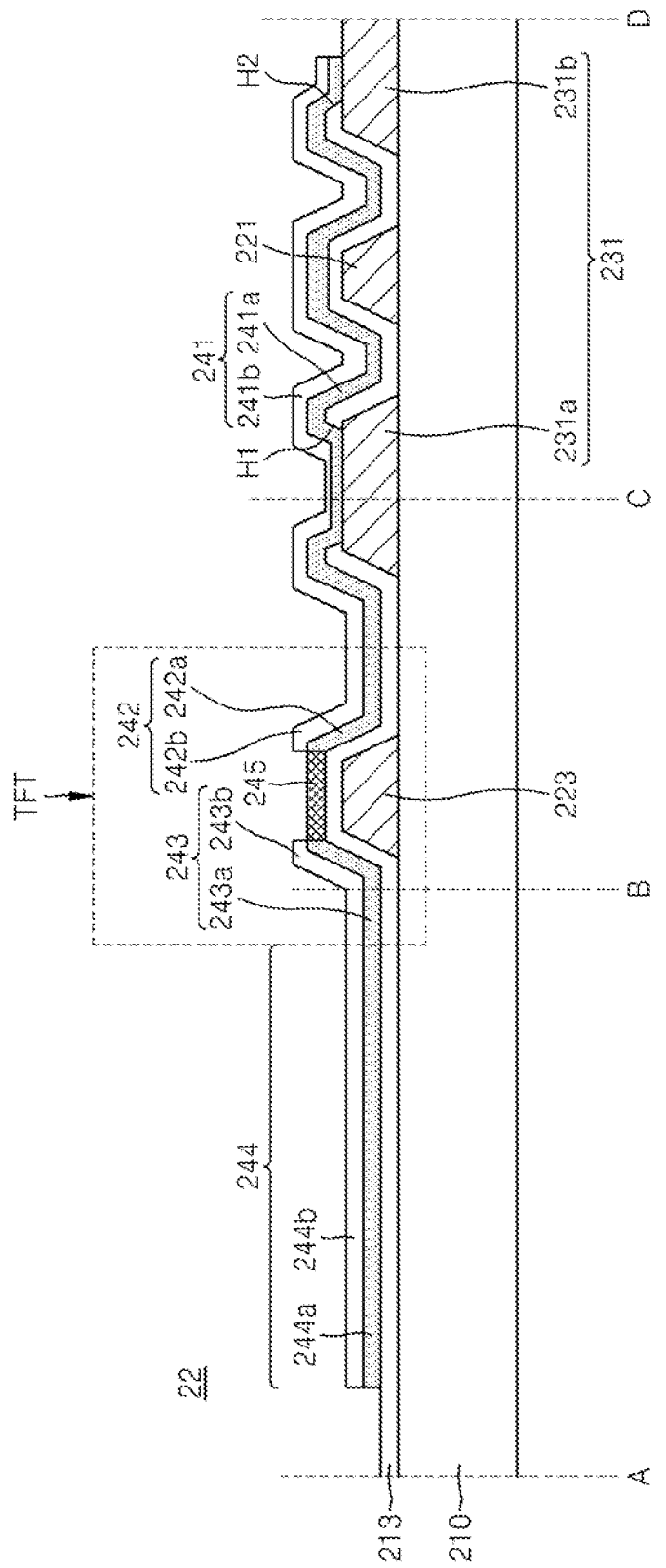
FIG. 3 is a cross-sectional view of a TFT array substrate according to another embodiment of the present disclosure.

FIG. 3 is a cross-sectional view of a TFT array substrate 22 according to another embodiment of the present disclosure. In FIGS. 1 and 3, like reference numbers refer to like elements. In FIG. 3, a repetitive description is omitted for briefness of description.

In the TFT array substrate 22 of FIG. 3, the pixel electrode 244, the drain electrode 243, the source electrode 242, and the connection wiring 241 have a plurality of layers, unlike the TFT array substrate 21 of FIG. 2.

The pixel electrode 244 may include a lower layer 244*a* and an upper layer 244*b*, the drain electrode 243 may include a lower layer 243*a* and an upper layer 243*b*, the source electrode 242 may include a lower layer 242*a* and an upper layer 242*b*, and the connection wiring 241 may include a lower layer 241*a* and an upper layer 241*b*. Here, the lower layers 244*a*, 243*a*, 242*a* and 241*a* may be made conductive by adjusting the oxide semiconductor carrier concentration, and the upper layers 244*b*, 243*b*, 242*b* and 241*b* may be formed of a conductive material.

Each of the lower layers 244*a*, 243*a*, 242*a* and 241*a* may become conductive by adjusting the oxide semiconductor carrier concentration as described above with reference to FIG. 2.

The upper layers 244*b*, 243*b*, 242*b* and 241*b* may include a material capable of being used as a general electrode. In some embodiments, the upper layers 244*b*, 243*b*, 242*b* and 241*b* may include at least one of silver (Ag), magnesium (Mg), aluminum (Al), platinum (Pt), palladium (Pd), gold (Au), nickel (Ni), neodymium (Nd), iridium (Ir), and chromium (Cr). In some embodiments, the upper layers 244*b*, 243*b*, 242*b* and 241*b* may include at least one of indium tin oxide (ITO), indium zinc oxide (IZO), zinc oxide (ZnO), and $In_2O_3$. The upper layers 244*b*, 243*b*, 242*b* and 241*b* may form a plurality of stacked layers.

FIGS. 4A to 4H are cross-sectional views that sequentially illustrate a method of manufacturing the TFT array substrates 21 and 22 according to embodiments of the present disclosure. FIG. 5 is a flowchart of a method of manufacturing the TFT array substrates 21 and 22 according to embodiments of the present disclosure. In a present embodiment, a process of manufacturing the TFT array substrate 21 disclosed in FIG. 1 is illustrated.

Referring to FIG. 4A, the gate electrode 223, the gate line 221, the first data line 231a, and the second data line 231b are formed on the substrate 210 in operation S1.

A first conductive layer may be deposited on the substrate 210, and then by selectively etching the first conductive layer using a first mask, the gate electrode 223, the gate line 221, the first data line 231a, and the second data line 231b may be formed. The etching process may be a wet etching, a dry etching, or a combination thereof.

Here, the first conductive layer may be formed of Al, an Al alloy, W, Cu, Ni, Cr, Mo, Ti, Pt, Ta, or a combination thereof. In addition, the first conductive layer may be formed of a transparent conductive material such as ITO or IZO. In some embodiments, the first conductive layer may have a Ti/Cu stack structure.

Figure 4B:
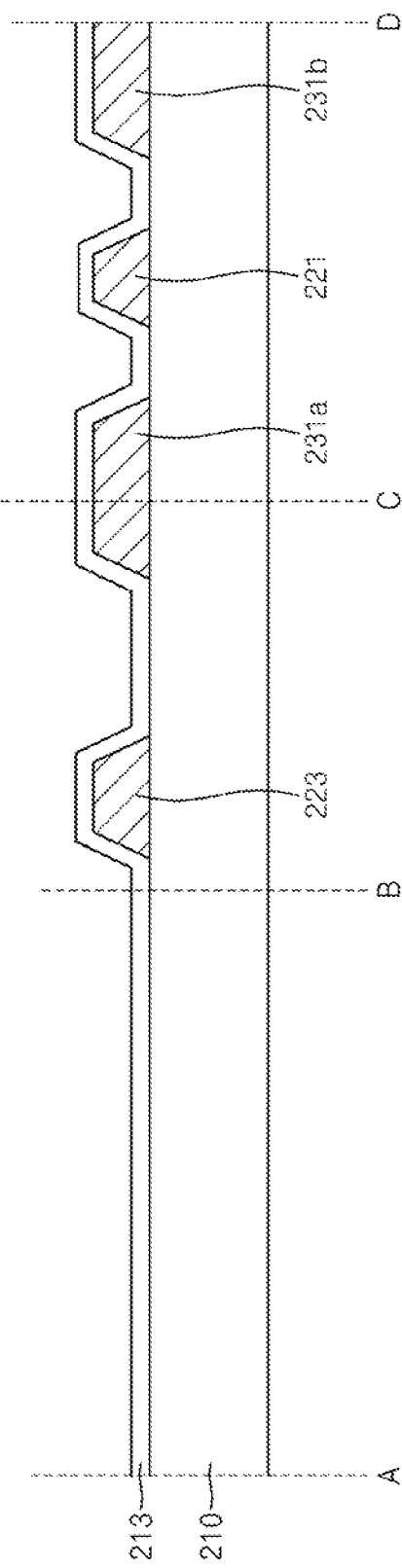
Figure 5:
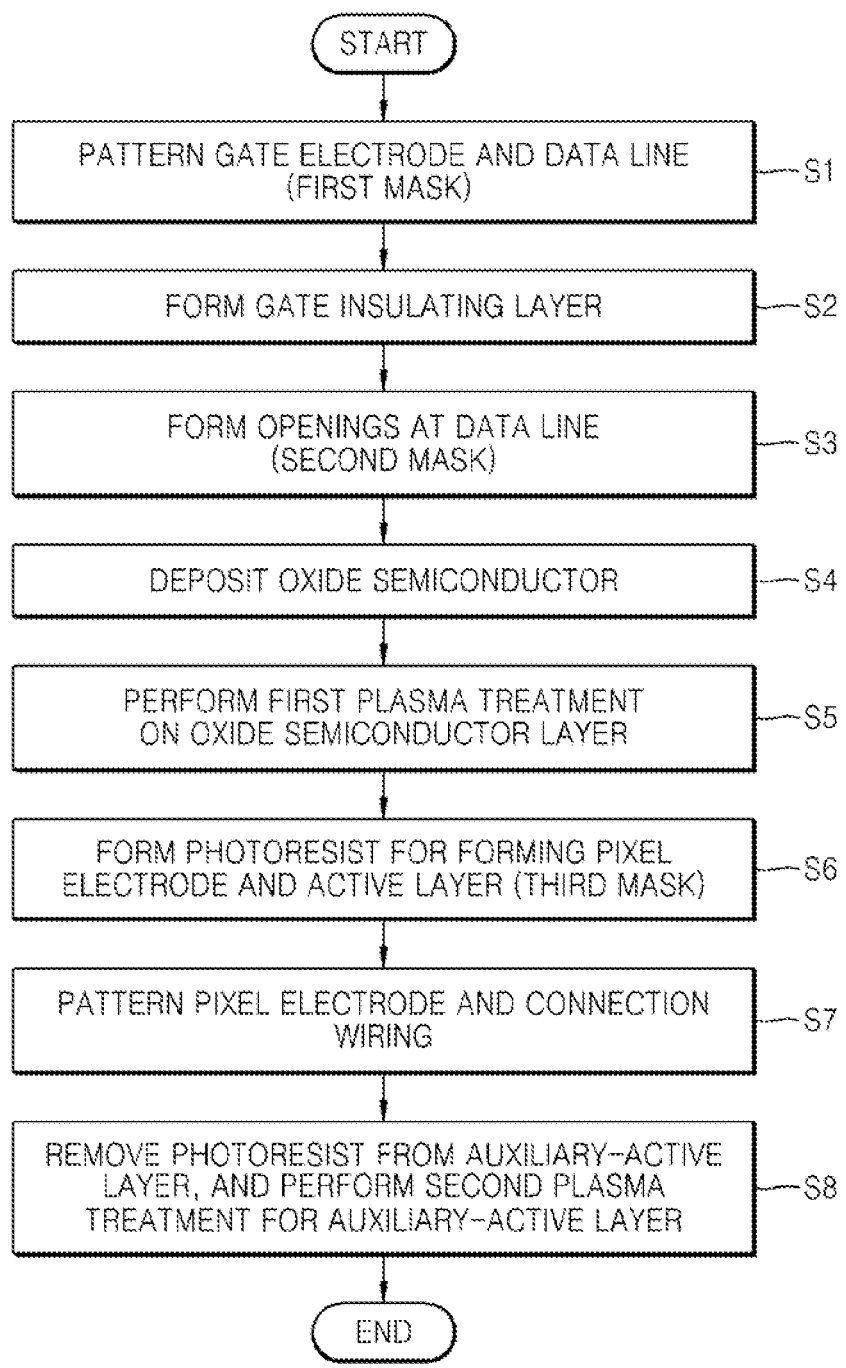
FIG. 5 is a flowchart of a method of manufacturing a TFT array substrate according to embodiments of the present disclosure.

Subsequently, as illustrated in FIG. 4B, the gate insulating layer 213 is formed over the substrate 210 on which the gate electrode 223, the gate line 221, the first data line 231a, and the second data line 231b have been formed, in operation S2.

The gate insulating layer 213 may be formed from an organic or inorganic insulating material. In some embodiments, the gate insulating layer 213 may be formed from a silicon nitride film (SiNx), a silicon oxide film ($SiO_2$), hafnium oxide, or aluminum oxide. The gate insulating layer 213 may be formed by various deposition methods, such as sputtering, chemical vapor deposition (CVD) or plasma enhanced chemical vapor deposition (PECVD).

Figure 4C:
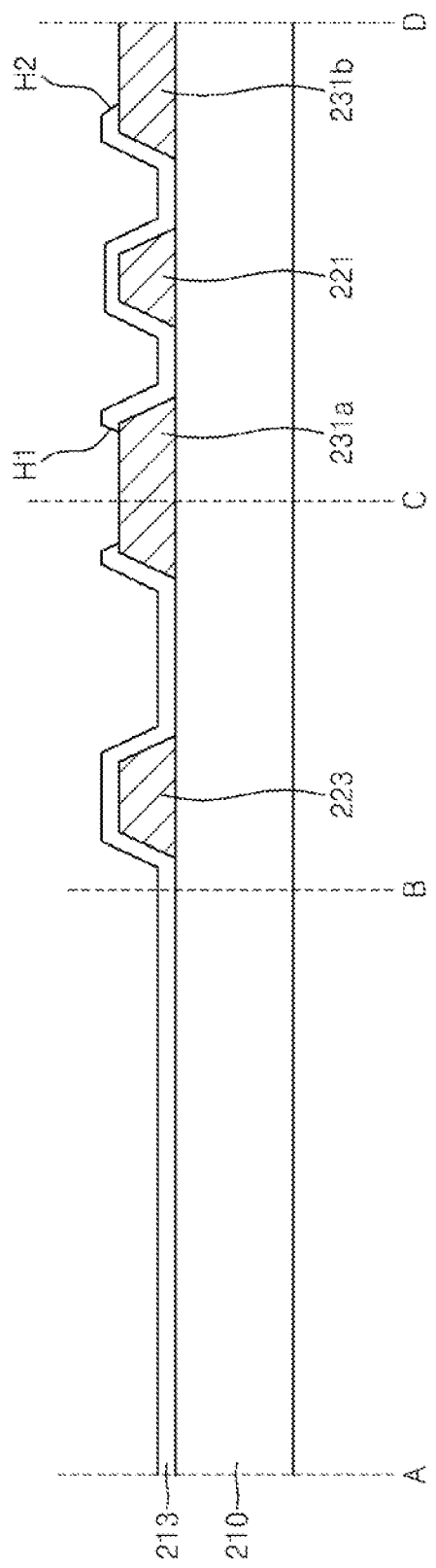

Subsequently, as illustrated in FIG. 4C, first and second openings H1 and H2 are respectively formed at the first and second data lines 231a and 231b in operation S3.

The first and second openings H1 and H2 are formed by selectively etching the gate insulating layer 213 using a second mask. The etching process may be a wet etching, a dry etching, or a combination thereof.

Figure 4D:
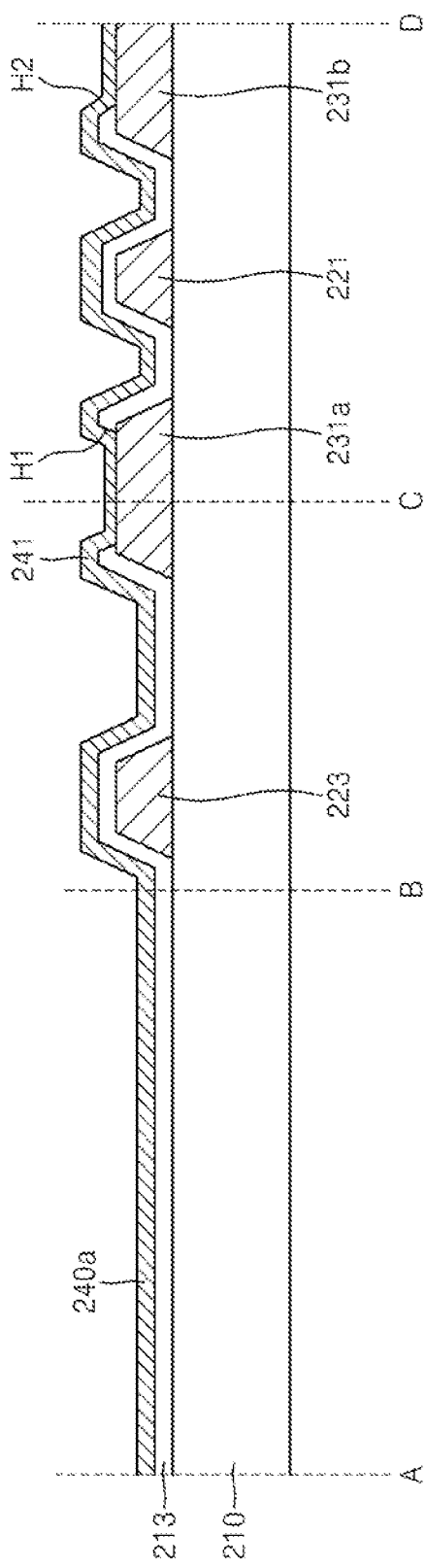

Subsequently, as illustrated in FIG. 4D, an oxide semiconductor layer 240a is deposited on the gate insulating layer 213 and the first and second openings H1 and H2 in operation S4.

The oxide semiconductor layer 240a is connected to the first data line 231a through the first opening H1, and is connected to the second data line 231b through the second opening H2. Therefore, the oxide semiconductor layer 240a connects the first and second data lines 231a and 231b.

The oxide semiconductor layer 240a may include an oxide of a material selected from group-12, 13 and 14 metal elements, such as zinc (Zn), indium (In), calcium (Ca), cadmium (Cd), germanium (Ge), and hafnium (Hf), or a combination thereof.

In some embodiments, the oxide semiconductor layer 240a may be formed from a Zn oxide-based material, for example, Zn oxide, In—Zn oxide, or Ga—In—Zn oxide. In some embodiments, the oxide semiconductor layer 240a may be an In—Ga—Zn—O (IGZO) semiconductor in which metals such as In and Ga are contained in ZnO. In some embodiments, a carrier concentration of the oxide semiconductor layer 240a may be within the range of about $10^{14}$ to about $10^{18}/cm^2$.

Subsequently, as illustrated in FIG. 4E, the first plasma treatment may be performed on the oxide semiconductor layer 240a in operation S5.

The oxide semiconductor layer 240a is made conductive through the first plasma treatment, thus forming a conductive oxide layer 240b.

The conductive oxide layer 240b denotes a state that is conductive because of an increase in the carrier concentration of the oxide semiconductor layer 240a. The carrier concentrations of the conductive oxide layer 240b may vary in the thickness direction. For example, the carrier concentration of the conductive oxide layer 240b is highest near the surface at which the first plasma treatment was performed, and decreases with increasing distance from that surface. However, the carrier concentration of the conductive oxide layer 240b is not limited thereto.

In some embodiments, the first plasma treatment may be performed using a hydrogen (H)-based gas, a fluorine (F)-based gas, or a combination thereof.

A hydrogen ($H_2$) gas may penetrate below the surface of the oxide semiconductor layer 240a to increase the carrier concentration, thereby decreasing surface resistance. In addition, plasma treatment using hydrogen gas may remove oxygen from the surface to reduce metal oxide, which also decreases surface resistance.

On the other hand, performing a fluorine-based plasma treatment increases an F component of the oxide semiconductor surface, which reduces the oxygen component to generate additional carriers at the surface. Accordingly, the carrier concentration increases, and the surface resistance decreases.

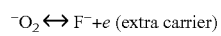

$^-O_2 \leftrightarrow F^- + e$ (extra carrier)

A fluorine (F)-based gas may be $CF_4$, $C_4F_8$, $NF_3$, $SF_6$, or a combination thereof, but is not limited thereto.

In another embodiment, the first plasma treatment may be performed using a nitrogen gas. An annealing process may be performed simultaneously with the nitrogen plasma treatment. In some embodiments, the annealing process may be performed for about one hour to about two hours at a temperature of about 300 degrees C. to about 400 degrees C.

Through the first plasma treatment, the oxide semiconductor layer 240a having a carrier concentration within the range of about $10^{14}$ to about $10^{18}/cm^2$ may be changed into the conductive oxide layer 240b having a carrier concentration of about $10^{19}/cm^2$ or more.

Figure 4F:
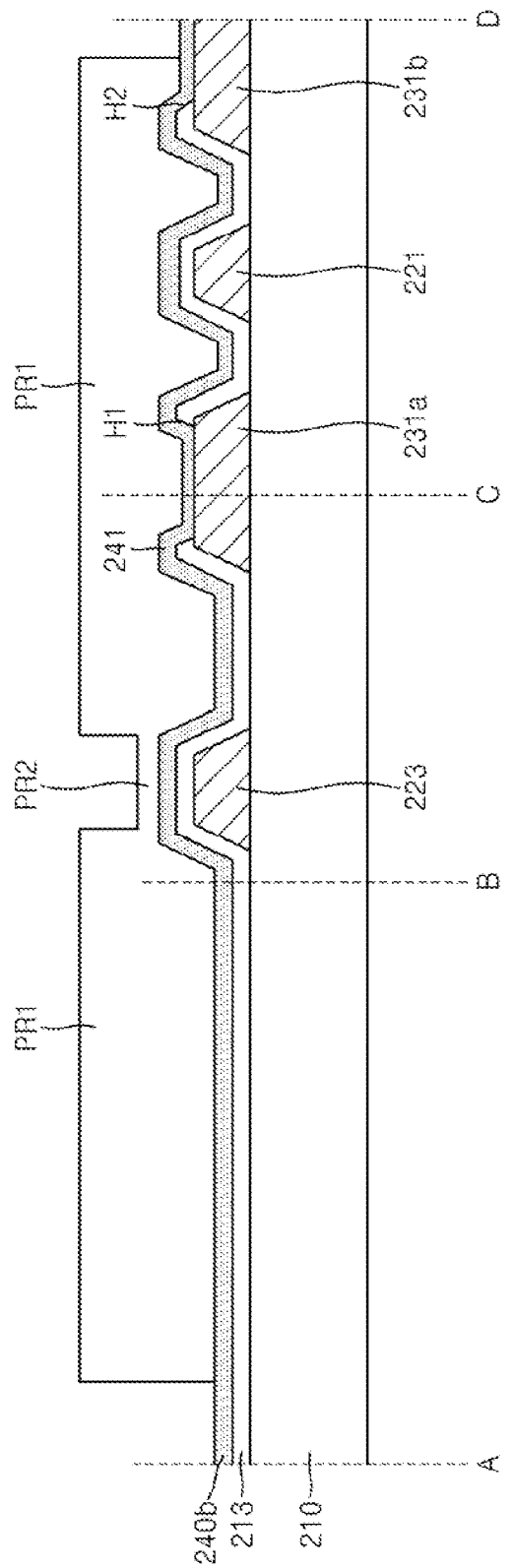

Subsequently, as illustrated in FIG. 4F, a third mask process is performed to form the pixel electrode 244, the drain electrode 243, the source electrode 242, the connection wiring 241, and the active layer 245.

A photoresist PR is formed on the conductive oxide layer 240b using a third mask in operation S6. The photoresist PR includes a first part PR1 and a second part PR2. The first part PR1 of the photoresist PR may be formed in a region corresponding to the pixel electrode 244, the drain electrode 243, the source electrode 242, and the connection wiring 241. The second part PR2 of the photoresist PR may be formed on an auxiliary-active layer 245a where the active layer will be formed.

The third mask may be a halftone mask. Therefore, the first and second parts PR1 and PR2 of the photoresist PR may have different thicknesses. A thickness of the second part PR2 may be less than that of the first part PR1.

Subsequently, the pixel electrode 244, the drain electrode 243, the source electrode 242, and the connection wiring 241 are formed by patterning an edge region of the conductive oxide layer 240b not covered by the photoresist PR by an etching process, in operation S7. The etching process may be a wet etching, a dry etching, or a combination thereof.

Subsequently, referring to FIG. 4G, the second part PR2 of the photoresist PR is removed by an etch-back process, to expose the auxiliary-active layer 245a that corresponds to a portion of the conductive oxide layer 240b in which the active layer 245 is to be formed. Then, the active layer 245 is formed by changing the auxiliary-active layer 245a into a semiconductor through a second plasma treatment in operation S8.

The carrier concentration of the oxide semiconductor, which was made conductive by the second plasma treatment, may be adjusted so that the oxide semiconductor may again be a semiconductor. In some embodiments, the second plasma treatment may include a process that supplies an oxygen-based plasma to the auxiliary-active layer 245a. For example, the oxygen-based plasma may be based on $N_2O$, but is not limited thereto. All gases capable of supplying oxygen to the auxiliary-active layer 245a may be used for the oxygen-based plasma.

In some embodiments, after the second plasma treatment, an alkali cleaning process may be additionally performed.

Through the second plasma treatment, a carrier concentration of the auxiliary-active layer 245a may be changed to be within a range of about $10^{14}$ to $10^{18}/cm^2$, thereby forming the active layer 245.

Figure 4H:
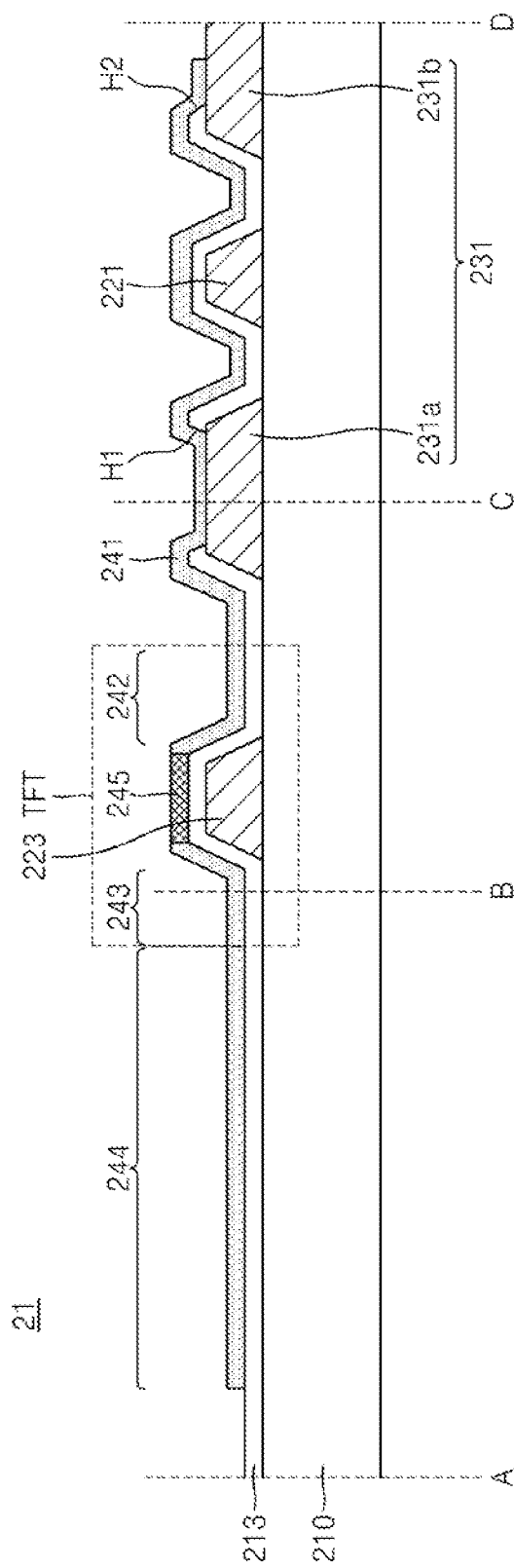

Subsequently, referring to FIG. 4H, the first part PR1 of the photoresist PR is removed, and by performing a cleaning process, the TFT array substrate 21 may be finished.

As described above, in a method of manufacturing the TFT array substrate 21 according to an embodiment of the present disclosure, a process is performed using three masks, and thus is simplified. Accordingly, process time and cost are reduced. An above-described method of manufacturing the TFT array substrate 21 may be modified. For example, a method may further include an operation that forms the pixel, source and drain electrodes 244, 243, 242 and the wirings 241 as a plurality of layers by further depositing an upper layer that includes a conductive material after operation S5, which is the first plasma treatment for the oxide semiconductor layer. In addition, a method may further include additionally forming a buffer layer, a passivation layer, etc.

Figure 6:
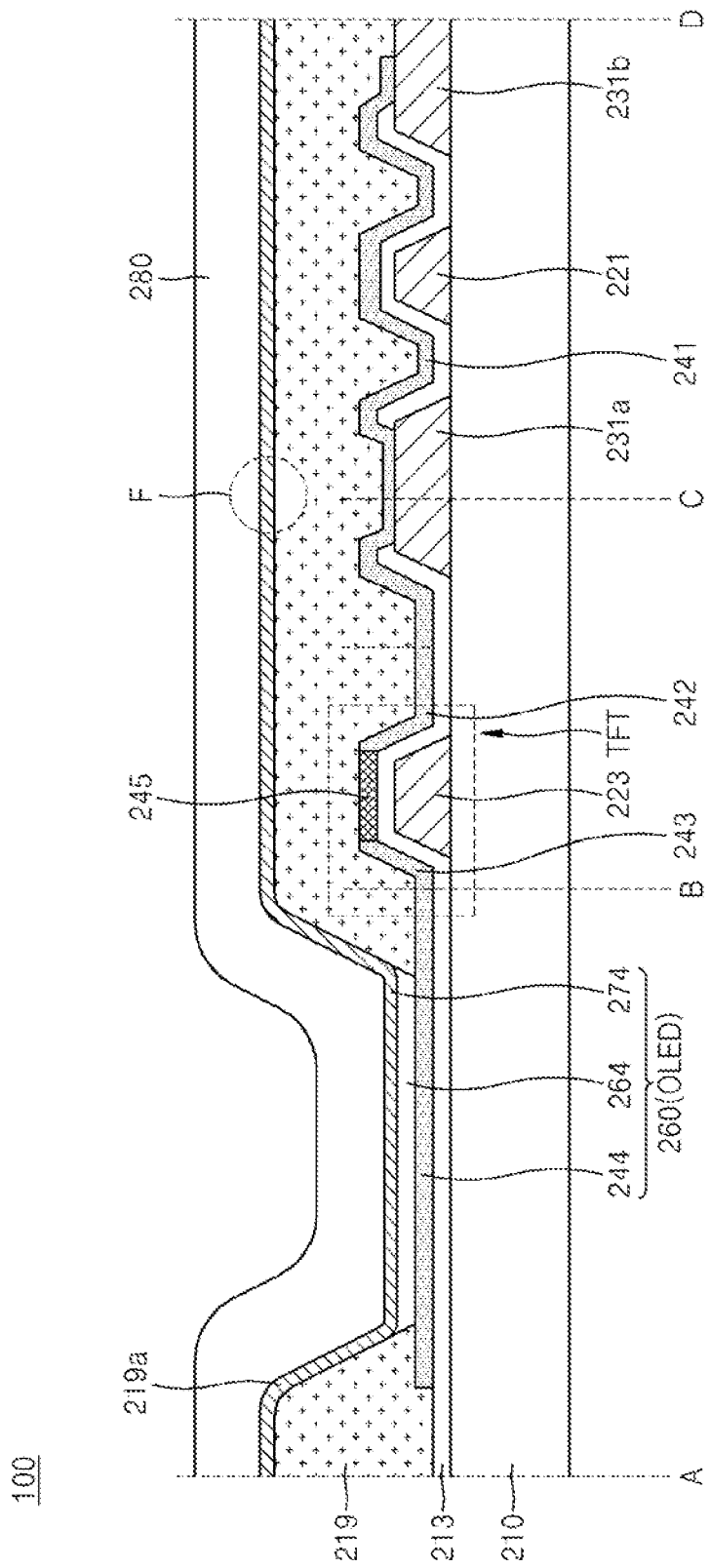
FIG. 6 is a cross-sectional view that schematically illustrates an organic light-emitting display apparatus according to an embodiment of the present disclosure.
Figure 7:
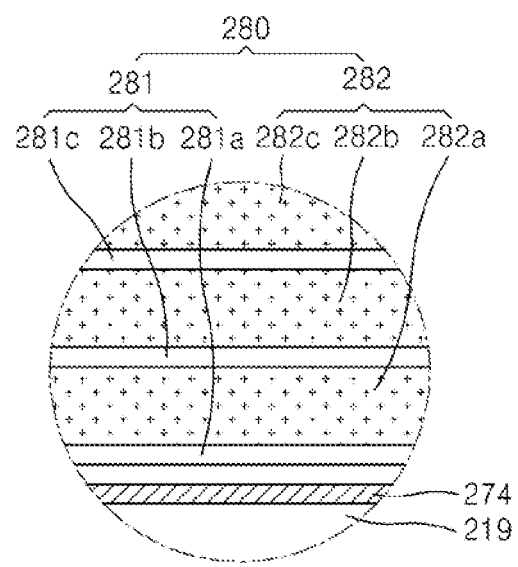
FIG. 7 is an enlarged view of a portion F of FIG. 6.

FIG. 6 is a cross-sectional view that schematically illustrates an organic light-emitting display apparatus 100 according to an embodiment of the present disclosure. FIG. 7 is an enlarged view of a portion F of FIG. 6. In FIGS. 2 and 6, like reference numbers refer to like elements. In FIG. 6, a repetitive description is omitted for briefness of description.

The organic light-emitting display apparatus 100 includes a pixel defining layer 219, an intermediate layer 264 that includes an organic emission layer, an opposite electrode 274, and an encapsulation unit 280, which are disposed on the TFT array substrate 21 or 22.

The pixel defining layer 219 may define a pixel region and a non-pixel region. The pixel defining layer 219 may include an opening 219a disposed in the pixel region, and may cover the TFT array substrate 21 or 22. The below-described intermediate layer 264 may be disposed in the opening 219a, and thus, the opening 219a may be the pixel region.

The pixel electrode 244, intermediate layer 264, and opposite electrode 274 of the TFT array substrate 21 or 22 constitute an organic light-emitting device 260. Holes and electrons injected from the pixel electrode 244 and opposite electrode 274 of the organic light-emitting device 260 may combine in the organic emission layer of the intermediate layer 264 to emit light.

The intermediate layer 264 may include an organic emission layer. In another embodiment, the intermediate layer 264 may include the organic emission layer and at least one of a hole injection layer (HIL), a hole transport layer (HTL), an electron transport layer (ETL), and an electron injection layer (EIL). Embodiments of the present disclosure are not limited thereto, and the intermediate layer 264 may further include various function layers in addition to an organic emission layer.

The opposite electrode 274 is formed on the intermediate layer 264. The opposite electrode 274 and the pixel electrode 244 generate an electric field to emit light from the intermediate layer 264. The pixel electrode 244 may be patterned for each pixel, and the opposite electrode 274 may be configured to apply a common voltage to all pixels.

The pixel electrode 244 and opposite electrode 274 may be formed of a transparent electrode or a reflective electrode. The pixel electrode 244 may act as an anode electrode, and the opposite electrode 274 may act as a cathode electrode. However, embodiments of the present disclosure are not limited thereto. For example, the pixel electrode 244 may act as the cathode electrode, and the opposite electrode 274 may act as the anode electrode.

In the drawings, one organic light-emitting device 260 is illustrated, but a display panel may include a plurality of organic light-emitting devices 260. Each organic light-emitting device OLED may constitute one pixel, and each pixel may display a red, green, blue, or white color.

However, embodiments of the present disclosure are not limited thereto. The intermediate layer 264 may be disposed over the entire pixel electrode 244 regardless of the position of each pixel. In this case, for example, the organic emission layer may be formed by vertically stacking or combining a plurality of layers that include respective light-emitting materials that emit red, green, and blue light. In addition, if the organic emission layer emits white light, a combination of colors and white may be realized. Furthermore, the organic light-emitting display apparatus 100 may further include a color filter or a color conversion layer which converts the emitted white light into a particular color.

A protective layer may be disposed on the opposite electrode 274, and may cover and protect the organic light-emitting device 260. The protective layer may use an inorganic insulating layer and/or an organic insulating layer.

The encapsulation unit 280 prevents external moisture, oxygen, etc., from penetrating into the organic light-emitting device 260 or the thin film transistor TFT.

The encapsulation unit 280 may include an inorganic layer 281 or an organic layer 282. The inorganic layer 281 may include a plurality of inorganic layers 281a, 281b and 281c, and the organic layer 282 may include a plurality of inorganic layers 282a, 282b and 282c. A structure in which the inorganic layers 281 and the organic layers 282 are alternately stacked is illustrated in FIG. 7, but the embodiments of the present disclosure are not limited thereto. The encapsulation unit 280 may be a single layer or a stacked layer. In some embodiments, the encapsulation unit 280 may include a low melting point glass material that contains tin oxide.

The encapsulation unit 280 is illustrated as having a layered structure, but is not limited thereto. For example, the encapsulation unit 280 may be an encapsulation substrate in which an edge thereof may be coupled to the substrate 210 by a sealant to seal the organic light-emitting display apparatus 100.

Figure 8:
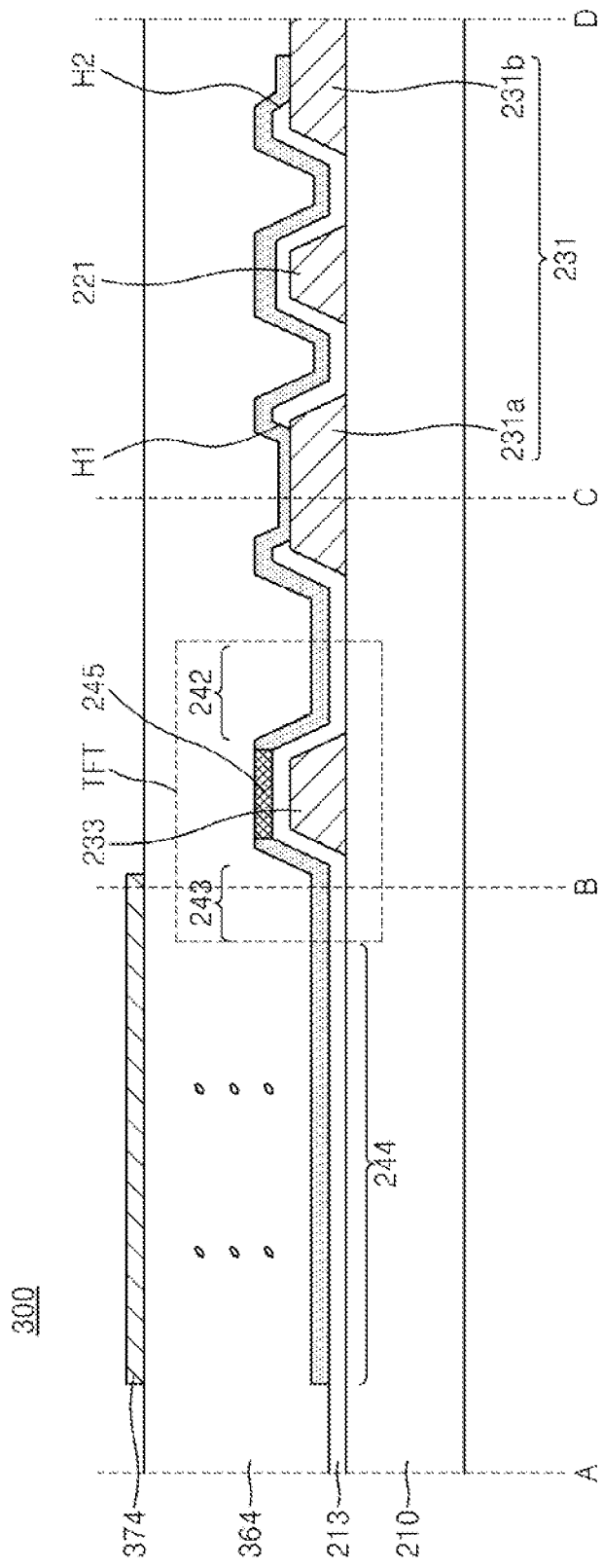
FIG. 8 schematically illustrates an LCD apparatus according to an embodiment of the present disclosure.

FIG. 8 schematically illustrates an LCD apparatus 300 according to an embodiment of the present disclosure. In FIGS. 2 and 8, like reference numbers refer to like elements. In FIG. 8, a repetitive description is omitted for briefness of description.

The LCD apparatus 300 includes an intermediate layer 364 that includes a liquid crystal, an opposite electrode 374, and a color filter layer, which are formed on the TFT array substrate 21 or 22.

The intermediate layer 364 may include the liquid crystal. The alignment of the liquid crystal may change due to an electric field generated by the pixel electrode 244 and the opposite electrode 374. The light transmittance of the intermediate layer 364 may vary according to the alignment of the liquid crystals in the intermediate layer 364.

The opposite electrode 374 is disposed on the intermediate layer 364. The opposite electrode 374 may be configured to apply a common voltage to each pixel. The opposite electrode 374 may be configured in various ways, such as a plurality of slits.

A color filter layer may be further disposed on the opposite electrode 374. The color filter layer may include a red, green, or blue filter, depending on the pixel. The color filter layer may color the light emitted from a backlight unit disposed under the TFT array substrate 21 or 22 which has propagated through the intermediate layer 364.

Although only one pixel is illustrated in the drawing, a display panel may include a plurality of pixels.

As described above, a TFT array substrate 21 or 22 according to an embodiment of the present disclosure may be used with an organic light-emitting display apparatus or an LCD apparatus, but is not limited thereto. The TFT array substrate 21 or 22 may be used with various other types of display apparatuses, such as a plasma display apparatus and an electrophoretic display apparatus.

As described above, according to exemplary embodiments of the present disclosure, a manufacturing process of a TFT array substrate uses three masks, and is thus simplified. Accordingly, process time and cost are reduced.

It should be understood that exemplary embodiments described therein should be considered in a descriptive sense only and not for purposes of limitation. Descriptions of features or aspects within each embodiment should typically be considered as available for other similar features or aspects in other embodiments.

While exemplary embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. A method of manufacturing a thin film transistor (TFT) array substrate, the method comprising:
    forming a gate electrode, a gate line, a first data line, and a second data line on a substrate through a first mask operation;
    forming a gate insulating layer that covers the gate electrode, the gate line, the first data line, and the second data line;
    forming a first opening and a second opening in the gate insulating layer that respectively expose a portion of the first data line and a portion of the second data line through a second mask operation;
    forming an oxide semiconductor layer on the gate insulating layer;
    performing a first plasma treatment on the oxide semiconductor layer to form a conductive oxide layer; and
    forming a pixel electrode, a drain electrode, a source electrode, a connection wiring, and an active layer from the conductive oxide layer through a third mask operation.

2. The method of claim 1, wherein,
    the active layer is disposed on the gate insulating layer wherein at least one portion of the active layer overlaps the gate electrode,
    the drain electrode and the source electrode extend from opposite sides of the active layer,
    the pixel electrode extends from the drain electrode, and
    the connection wiring connects the first data line to the second data line through the first opening and the second opening.

3. The method of claim 1, wherein, the third mask operation comprises:
    forming a photoresist on the conductive oxide layer using a halftone mask, wherein said photoresist includes a first part and a second part having a thickness less than a thickness of the first part;
    etching the conductive oxide layer to form the pixel electrode, the drain electrode, the source electrode, and the connection wiring;
    etching the second part of the photoresist to expose an auxiliary-active layer in the conductive oxide layer; and
    performing a second plasma treatment on the auxiliary-active layer to form the active layer, wherein the second plasma treatment changes the auxiliary-active layer into a semiconductor, wherein the first part of the photoresist is formed in a region corresponding to the pixel electrode, the drain electrode, the source electrode, and the connection wiring, and the second part of the photoresist is formed on the auxiliary-active layer.

4. The method of claim 3, further comprising removing the first part of the photoresist, and performing a cleaning process.

5. The method of claim 3, wherein
    the second plasma treatment uses an oxygen-containing gas that changes the auxiliary-active layer into the active layer by changing a carrier concentration of the conductive oxide layer, wherein the active layer is a semiconductor.

6. The method of claim 3, wherein the second plasma treatment changes a carrier concentration of the active layer to a value within a range of about $10^{14}$ to about $10^{18}/cm^2$.

7. The method of claim 1, wherein the first plasma treatment uses a hydrogen (H)-based gas, a fluorine (F)-based gas, or a combination thereof.

8. The method of claim 1, wherein the first plasma treatment uses a nitrogen ($N_2$)-based gas, and includes an annealing process at a temperature of about 300 degrees C. to about 400 degrees C.

9. The method of claim 1, wherein the oxide semiconductor layer is an In—Ga—Zn—O (IGZO) semiconductor.

* * * * *